United States Patent [19]
Murphy et al.

[11] Patent Number: 4,928,820
[45] Date of Patent: May 29, 1990

[54] SNAP ON BUMPER FOR ELECTRONIC PACKAGES

[75] Inventors: Robert H. Murphy, Merrimack; Roland Gosselin, Nashua, both of N.H.

[73] Assignee: R. H. Murphy Company, Inc., Amherst, N.H.

[21] Appl. No.: 377,164

[22] Filed: Jul. 7, 1989

[51] Int. Cl.⁵ .............................. B65D 73/02
[52] U.S. Cl. ................... 206/328; 206/334; 206/583; 206/593
[58] Field of Search ........... 206/328, 334, 583, 586, 206/591, 593, 592; 361/212, 220

[56] References Cited
U.S. PATENT DOCUMENTS

| 4,016,976 | 4/1977 | Cosper | 206/583 |
| 4,598,820 | 7/1986 | Murphy | 206/334 |
| 4,635,794 | 1/1987 | Lemmer | 206/334 |
| 4,706,812 | 11/1987 | Spinelli et al. | 206/334 |
| 4,721,206 | 1/1980 | Votter | 206/334 |
| 4,836,371 | 6/1989 | Long et al. | 206/328 |
| 4,841,630 | 6/1989 | Lubranski et al. | 206/328 |

FOREIGN PATENT DOCUMENTS 1295772 5/1969 Fed. Rep. of Germany .......... 206/5

Primary Examiner—David T. Fidei
Attorney, Agent, or Firm—Pearson & Pearson

[57] ABSTRACT

A snap on bumper for protecting integrated circuits and like components from damage during various handling operations. The bumper comprises end portions that overlie the ends of the components and absorb shock. Interconnecting struts interconnect the ends and have a bowed construction to enable a range of distance variations between the ends. Lip portions on each end facilitate a positive clamping of the bumper to the component.

12 Claims, 1 Drawing Sheet

U.S. Patent
May 29, 1990
4,928,820
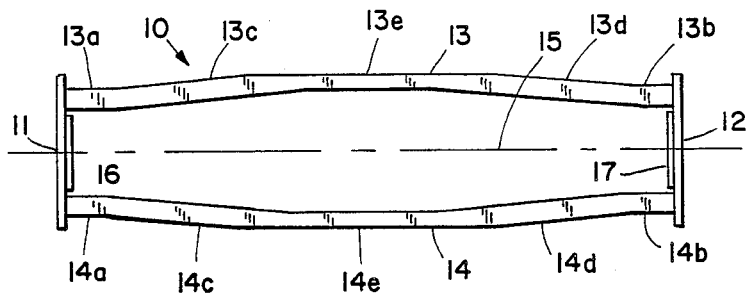
Fig. 1
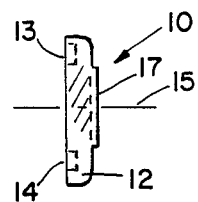
Fig. 2
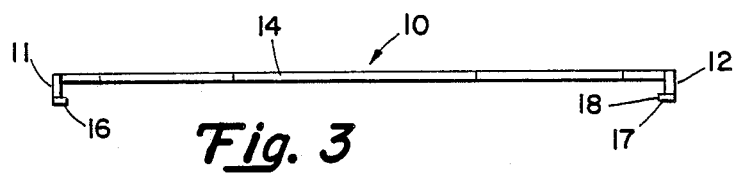
Fig. 3
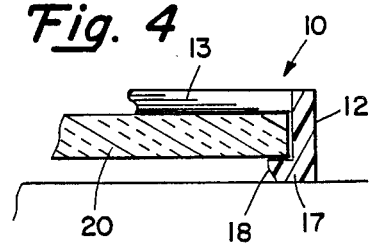
Fig. 4
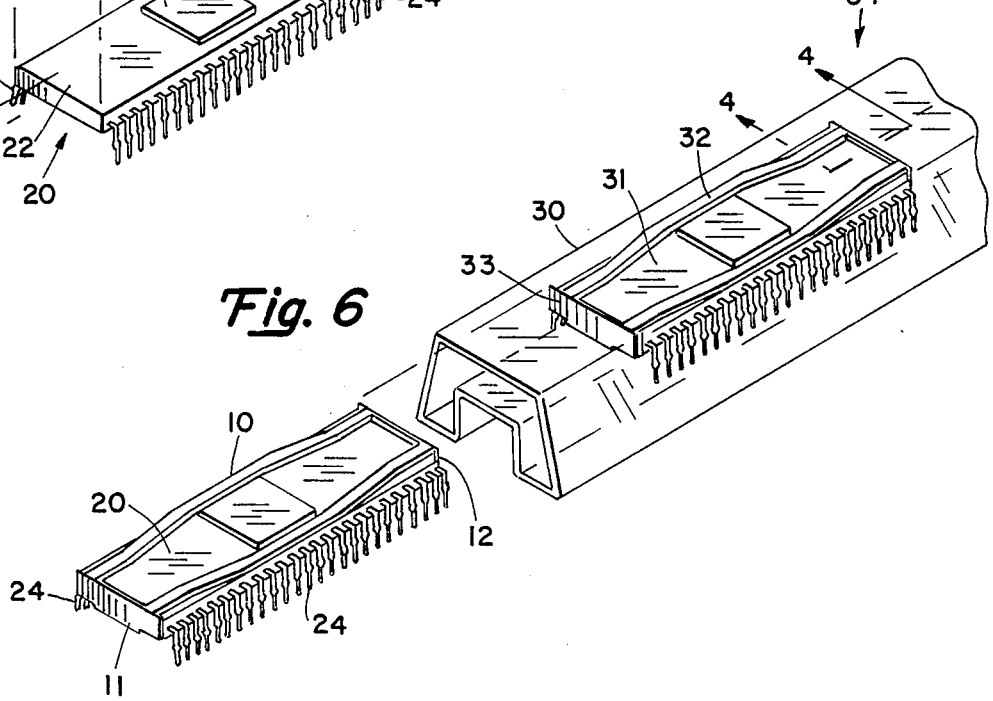
Fig. 5
Fig. 6

SNAP ON BUMPER FOR ELECTRONIC PACKAGES

FIELD OF THE INVENTION

This invention generally relates to electronic components including integrated circuits and the like, electronic components and more specifically to devices for protecting such components.

BACKGROUND OF THE INVENTION

Reference is made to the following U.S. Pat. Nos.:
4,552,267, (1985), Layher;
4,598,820, (1986), Murphy.

Integrated circuits represent a class of components that conventionally are loaded into carriers or shipping tubes for shipment. A customer then normally handles the components within its facility in those carriers or shipping tubes. Initially such carriers merely included pins or other stop elements for capturing multiple integrated circuits within the carrier. However, many components, especially integrated circuits in hermetically sealed packages, are susceptible to damage during these loading and handling operations.

During loading, for example, the carriers are tilted so individual integrated circuits can slide down the carrier stopping when they strike another integrated circuit that has been previously inserted. During handling the integrated circuits are free to slide along the carrier because some space accumulates between adjacent integrated circuits. Such sliding can result in significant impacts, as oftentimes a mass of two or more integrated circuits can and do move as a group.

The impact of adjacent integrated circuits during these loading and handling operations can become particularly troublesome with ceramic integrated circuits. The ceramic can chip and crack thereby breaking a hermetic seal and leading to immediate failure of the integrated circuit or rapid failure of the equipment after such an integrated circuit has been installed.

A number of solutions to this impact problem have been proposed. In the Layher patent, for example, the integrated circuit is custom manufactured with bumps on the end of each integrated circuit package by in situ molding of specific material, with additional manufacturing costs. During assembly to circuit boards, air around the integrated circuits can reach a rather high temperature (as during wave or other soldering operations). These bumps tend to have a low melting temperature, so they can soften and distort the package.

The Murphy patent discloses an internal plastic spring at one or both ends of the tube to force adjacent packages in a shipping tube in close proximity thereby to minimize impact during shipping and handling. However, problems of impact during the loading of the tube and during other operations after the integrated circuits are removed from the carrier are not addressed in this approach.

SUMMARY OF THE INVENTION

Therefore, it is an object of this invention to provide an improved bumper for individual electronic packages such as integrated circuits.

Another object of this invention is to provide an improved bumper that protects an electronic package during storage, handling and other operations.

Still another object of this invention is to provide an improved bumper that is readily removable from an electronic package.

Yet another object of this invention is to provide an improved bumper that is easy and inexpensive to manufacture and to assemble with an electronic package.

Still yet another object of this invention is to provide an improved bumper that adopts to a reasonable range of tolerances in the overall size of an electronic package.

In accordance with this invention, a discrete bumper includes ends for engaging the opposite end surfaces of an electronic package, such as an integrated circuit, to form shock-absorbing bumper surfaces across the ends of the package. Interconnecting struts space the ends at a distance corresponding to a predetermined nominal length of the electronic package. These interconnecting struts are positioned adjacent a first surface of the package and are capable of being elongated thereby to increase the space between the ends of the bumper and to produce a restoring force for clamping the ends against the end surfaces of the package. In certain embodiments lips at the ends coact with the interconnecting struts and the ends to capture the electronic package.

DETAILED DESCRIPTION OF THE DRAWINGS

This invention is pointed out with particularity in the appended claims. The various objects, advantages and novel features of this invention will be more fully apparent from a reading of the following detailed description in conjunction with the accompanying drawings in which like reference numerals refer to like parts, and in which:

FIG. 1 is a top plan view of a bumper constructed in accordance with this invention;

FIG. 2 is an end view of a bumper constructed in accordance with this invention;

FIG. 3 is a front view of a bumper constructed in accordance with this invention;

FIG. 4 is a detailed view taken along lines 4—4 in FIG. 6;

FIG. 5 is an exploded view of a bumper constructed in accordance with this invention and a typical integrated circuit;

FIG. 6 is an exploded view showing integrated circuits utilizing a bumper constructed in accordance with this invention and being inserted in a shipping tube or carrier.

DETAILED DESCRIPTION OF THE PREFERRED EMBODIMENTS

Referring to FIGS. 1 through 3, a bumper 10 is constructed as an integral, molded or cast structure from a resilient material. A number of materials can be used, but a high temperature resilient plastic taken from the group consisting of polyetherimides and polyethersulfones provide satisfactory results. Ultem ® supplied by General Electric Company and Victrex ® manufactured by ICI Corp. are examples of polyetherimides and polyethersulfones, respectively, that can be used to manufacture the bumper 10.

Still referring to FIGS. 1 through 3, the bumper 10 comprises planar end portions 11 and 12 and interconnecting struts 13 and 14. The interconnecting struts 13 and 14 maintain the planar ends 11 and 12 in a parallel relationship. The length of the interconnecting struts 13 and 14 corresponds to the length of the integrated circuit package to which the bumper is to be applied. As will become apparent later, the distance between the planar end portions 11 and 12 corresponds to a nominal length of an integrated circuit, taking tolerances into account.

In this particular embodiment each of the intermediate struts 13 and 14 has five sections extending in seriatim between the planar end portions 11 and 12. End sections 13a and 13b extend from the planar ends 11 and 12 and are in line with each other. Offsetting intermediate sections 13c and 13d extend toward and support and connect to a central section 13e that is essentially parallel to the sections 13a and 13b. Similarly, sections 14a and 14b of the interconnecting strut 14 extend from the ends 11 and 12 while offsetting sections 14c and 14d interconnect the sections 14a and 14b with a central section 14e. The central section 14e essentially is parallel to the sections 14a and 14b.

The central sections 13e and 14e are thinner than the other sections and are parallel to each other and to a central longitudinal axis 15 through an integrated circuit. The distance between the central sections 13e and 14e is greater than the distance between either the sections 13a and 14a and or the sections 13b and 14b. This construction produces an interconnecting strut between the planar ends 11 and 12 that is bowed in appearance. If the central sections 13e and 14e are displaced toward the central axis 15, the distance between the ends 11 and 12 increases slightly and vice versa. This incremental movement can be controlled by the amount of offset to accommodate a range of tolerances of the length of the package to which the bumper is attached.

The planar end portions 11 and 12 can include centrally disposed lip portions 16 and 17 that extend from the bottom of the end portions 11 and 12 toward the center of the bumper 10 and parallel to the interconnecting struts 13 and 14. As particularly shown in FIGS. 3 and 4, the lip portion 17, with a radiused surface 18, the end portion 12 and the interconnecting struts (only 14 is shown in FIG. 4) interact to capture the end of an integrated circuit and ceramic package 34. The radius 18 prevents the lip 17 from catching an end of the shipping tube or other handling device over which it slides.

FIG. 5 depicts a bumper 10 constructed in accordance with this invention positioned over a typical integrated circuit 20. A ceramic housing 21 contains the integrated circuitry and has ends 22 and 23. Connector contacts 24 extend along both sides of the integrated circuit and the circuit 20 may have a center pad 25. In this drawing, it will be apparent that the bumper ends 11 and 12 are spaced by a distance corresponding to the length of the integrated circuit 20 between the ends 22 and 23.

During installation from the position shown in FIG. 5 to that shown in FIG. 6, an individual hooks one or the other ends of the bumper 10 around a corresponding end of the integrated circuit 20. For example, one could place the end 11 against the integrated circuit end 22, whereby the interconnecting struts 13 and 14, the end 11 and lip 16 would capture the end 22 of the integrated circuit. When a force is applied to the other end 12 away from the end 11, the struts 13 and 14 deflect toward each other thereby to increase the length of the bumper 10 until the lip 17 passes over the end 23 and under the ceramic housing 21. During this particular operation, internal stresses build in the struts 13 and 14. When the end 12 and lip 17 pass over the end 23, the bumper 10 partially relaxes and snaps into final position. Some internal stress remains, however, so a restoring force clamps the integrated circuit 20 in the bumer 10.

As shown in FIG. 6 the end portions 11 and 12 overlie the ends 22 and 23 of the integrated circuit and provide a shock-absorbing bumper. As the integrated circuit 20 and bumper 10 slide along a carrier tube 30 during a loading operation they strike and stop against other integrated circuits 31 and bumper 32. The interposition of the end portions 12 and an end portion 33 on the bumper 32, prevents the ceramic packages from direct contact. The ends 12 and 33 absorb some of the momentum and spread the impact forces thereby minimizing the chances of chipping the ceramic material and breaking any hermetic seal. Similar absorption and force spreading occurs when adjacent integrated circuits strike each other during handling.

Thus, in accordance with the various aspects of this invention, a bumper of high temperature resilient plastic captures an integrated circuit package or like element and overlies the ends of an electronic component to provide a shock absorbing protective barrier between adjacent elements. The bumpers are simple and inexpensive to manufacture and provide protection without any modification in the manufacturing process for the electronic element. Moreover, they can remain installed on a component until assembly has been completed because they can withstand the environments encountered in electronic production, particularly elevated temperatures at a soldering station.

This invention has been disclosed in terms of a specific embodiment. It will be apparent that many modifications can be made to the disclosed apparatus without departing from the invention. Therefore, it is the intent of the appended claims to cover all such variations and modifications as come within the true spirit and scope of this invention.

What is claimed as new and desired to be secured by Letters Patent of the U.S. is:

1. A shock absorbing bumper for oppositely disposed planar end surfaces of a device that is adapted to move along a longitudinal axis transverse to the planar end surfaces, the end surfaces being spaced a predetermined distance from each other, and that has a surface extending between the end surfaces, said bumper comprising:
   A. overlying end means for overlying the opposite end surfaces of the device thereby to form a shock-absorbing bumper surface at each end surface parallel thereto,
   B. integral interconnecting means for establishing a parallel relationship between said end means with a spacing between said end means corresponding to the predetermined distance, said interconnecting means being positioned adjacent to the surface of the device and being capable of elastic elongation for increasing the spacing between said overlying end means and producing a restoring force for clamping a device between said overlying end means.

2. A bumper as recited in claim 1 wherein said bumper is formed of a heat resistant thermoplastic material.

3. A bumper as recited in claim 2 wherein said heat resistant thermoplastic material is taken from a group consisting of polyetherimides and polyethersulfones.

4. A bumper as recited in claim 1 wherein each said end means comprises a planar portion for abutting the corresponding end surface of the device and lip means on said planar portion parallel to and spaced from said interconnecting means for engaging another surface of the device parallel to first surface.

5. A bumper as recited in claim 1 wherein each said interconnecting means includes parallel and offsetting portions in seriatim for permitting the elastic elongation of said interconnecting member thereby to generate the restoring force.

6. A bumper as recited in claim 5 wherein each said end means comprises a planar portions for abutting a corresponding end surface of the device and lip means parallel to and spaced from said interconnecting means for engaging another surface of the device parallel to the first surface, said planar portions, lip portions and interconnecting members being composed of a high temperature resilient plastic taken from the group consisting of the polyetherimides and polyethersulfones.

7. A shock absorbing bumper for protecting oppositely disposed end surfaces of an electronic element that are spaced a predetermined distance from each other, said bumper comprising:
  A. first and second overlying end means for overlying each of the opposite end surfaces of the electronic device thereby to form a shock-absorbing bumper surface over each end surface,
  B. first and second interconnecting strut means integrally formed with said end means for establishing a spacing between said first and second end means corresponding to the predetermined distance, said interconnecting strut means being positioned adjacent to a surface of the electronic element and being capable of elastic elongation element for increasing the spacing between said overlying end means and producing a restoring force for clamping the electronic element between said overlying end means.

8. A bumper as recited in claim 7 wherein said bumper is formed of a heat-resistant thermoplastic material.

9. A bumper as recited in claim 8 wherein said heat resistant thermoplastic material is taken from a group consisting of polyetherimides and polyethersulfones.

10. A bumper as recited in claim 7 wherein each said overlying end means comprises a planar portion for abutting a corresponding end surface and lip means on said planar portion parallel to and spaced from said interconnecting strut means for engaging another surface of the device parallel to the first surface.

11. A bumper as recited in claim 7 wherein each of said interconnecting strut means includes parallel and offsetting portions in seriatim for permitting the elastic elongation of said interconnecting member through elastic deformation thereby to generate the restoring force.

12. A bumper as recited in claim 11 wherein each said overlying end means comprises a planar portion for abutting a corresponding end surface of the electronic element and lip means on said planar portion parallel to and spaced from said interconnecting strut means for engaging another surface of the device parallel to the first surface, said planar portions, lip portions and interconnecting members being composed of a high temperature resilient plastic taken from the group consisting of the polyetherimides and polyethersulfones.

* * * * *